US009838008B2

(12) United States Patent
Lark, Jr. et al.

(10) Patent No.: US 9,838,008 B2
(45) Date of Patent: Dec. 5, 2017

(54) MODULAR INTERFACE OF INTELLIGENT LIGHTING CONTROL APPARATUSES, SYSTEMS, AND METHODS

(71) Applicant: Locoroll, Inc., Cupertino, CA (US)

(72) Inventors: William Lark, Jr., Glendale, CA (US); Ann Claire Lim Chi Cheung, San Francisco, CA (US); Nicholas David Pennycooke, San Mateo, CA (US)

(73) Assignee: Noon Home, Inc., Cupertino, CA (US)

( * ) Notice: Subject to any disclaimer, the term of this patent is extended or adjusted under 35 U.S.C. 154(b) by 0 days.

(21) Appl. No.: 15/452,585

(22) Filed: Mar. 7, 2017

(65) Prior Publication Data

US 2017/0257096 A1    Sep. 7, 2017

Related U.S. Application Data

(60) Provisional application No. 62/304,655, filed on Mar. 7, 2016.

(51) Int. Cl.
*H03K 17/945* (2006.01)
*H03K 17/96* (2006.01)

(52) U.S. Cl.
CPC ......... *H03K 17/962* (2013.01); *H03K 17/945* (2013.01)

(58) Field of Classification Search
CPC ............................ H03K 17/962; H03K 17/945
USPC .................................................. 315/246–287
See application file for complete search history.

(56) References Cited

U.S. PATENT DOCUMENTS

| 7,202,789 | B1* | 4/2007 | Stilp | G05B 9/03 340/568.2 |
|---|---|---|---|---|
| 2007/0216318 | A1 | 9/2007 | Altonen et al. | |
| 2007/0291010 | A1 | 12/2007 | Altonen et al. | |
| 2008/0012848 | A1 | 1/2008 | Snyder et al. | |
| 2011/0255303 | A1* | 10/2011 | Nichol | G02B 6/006 362/606 |
| 2012/0033414 | A1* | 2/2012 | Sharrah | F21L 4/04 362/183 |
| 2013/0155723 | A1* | 6/2013 | Coleman | G02B 6/0018 362/621 |
| 2014/0015977 | A1* | 1/2014 | Taylor | B60C 23/0408 348/148 |

(Continued)

OTHER PUBLICATIONS

International Search Report and Written Opinion for App. Ser. No. PCT/US17/21159, dated May 26, 2017, 9 pages.

*Primary Examiner* — Brandon S Cole

(74) *Attorney, Agent, or Firm* — Fish & Richardson P.C.

(57) ABSTRACT

The present disclosure provides modular lighting control system interfaces and method of implementing modular lighting control system interface for a lighting control system. The lighting control system includes a light switch module including a light switch actuator coupled to an actuator circuit board system. The light switch actuator is configured to move with respect to the actuator circuit board. The actuator circuit board includes a low power circuit electrically connected to a low power circuit electrical connector. The light switch also includes a light switch base module including a base housing forming a well configured to receive, at least in part, the actuator circuit board. The high power circuit electrical connector is configured to engage the low power circuit electrical connector. The high power circuit board includes a voltage reducer.

29 Claims, 13 Drawing Sheets

(56) References Cited

U.S. PATENT DOCUMENTS

2014/0265883 A1* 9/2014 Mortun .............. H05B 33/0842
                                                    315/158
2015/0062783 A1* 3/2015 Lark ...................... H01G 2/103
                                                    361/518

* cited by examiner

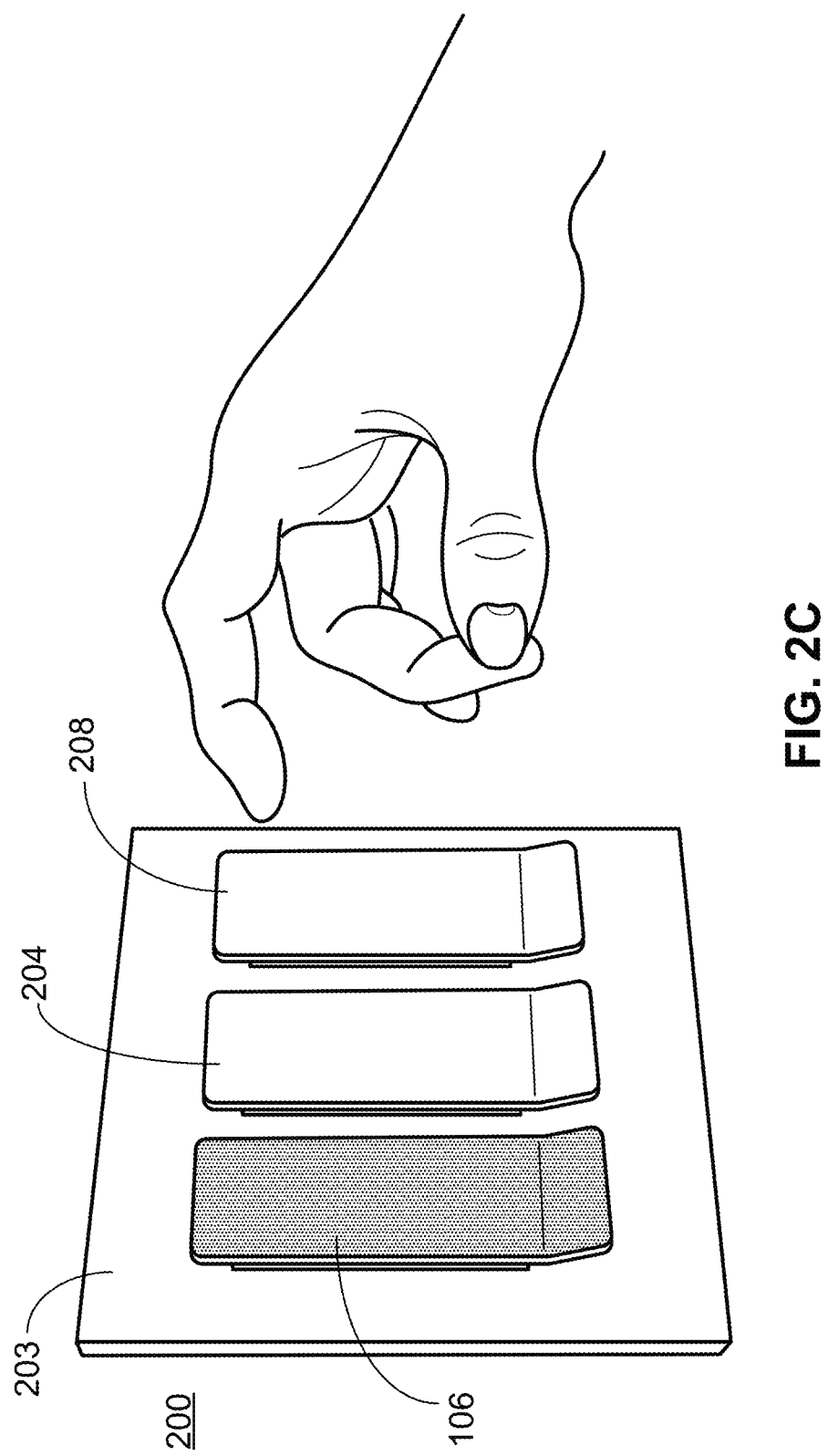

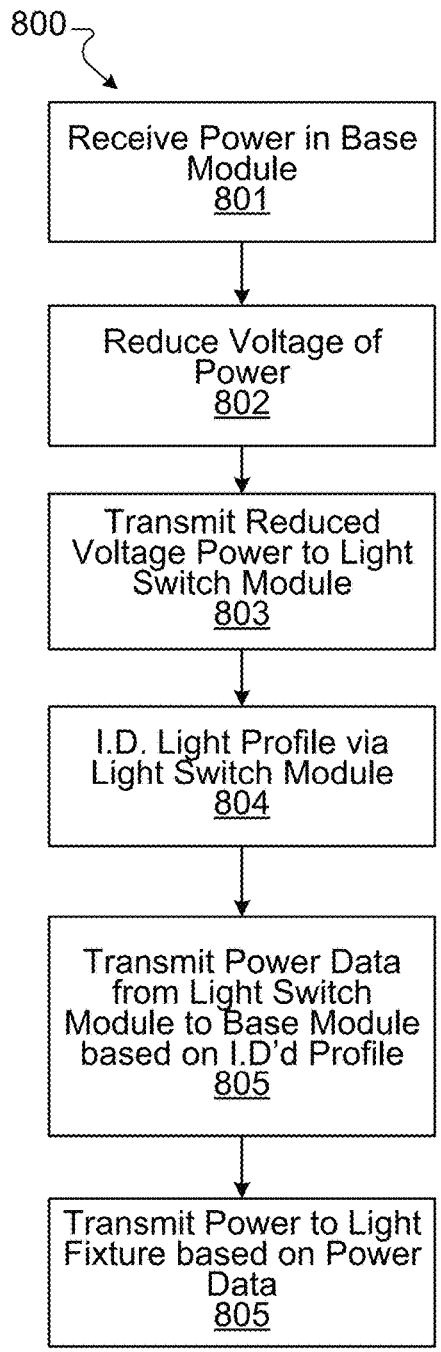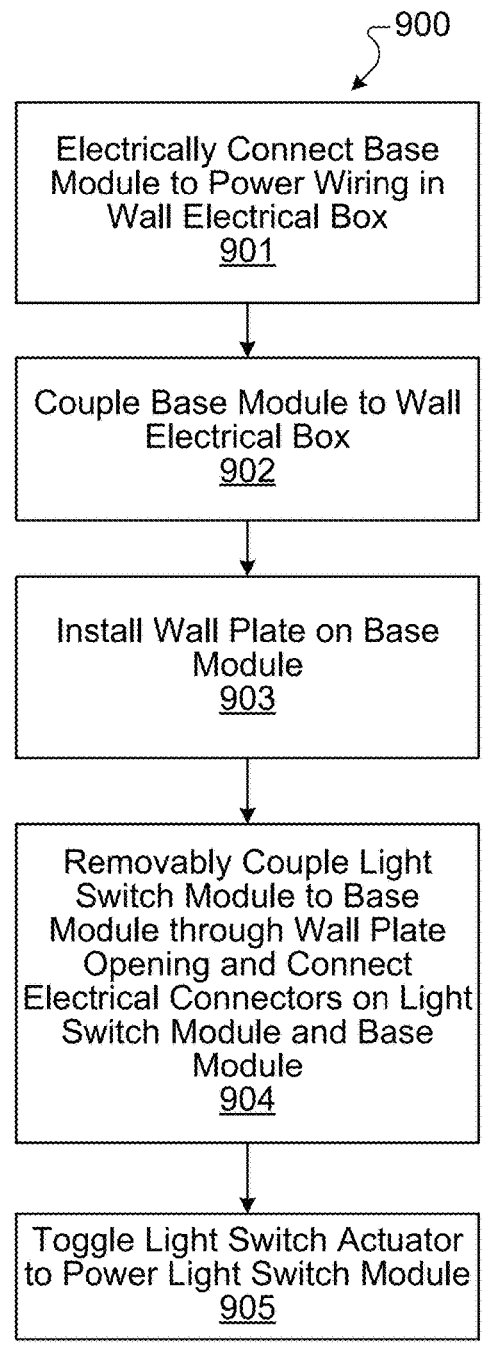
FIG. 8
FIG. 9

MODULAR INTERFACE OF INTELLIGENT LIGHTING CONTROL APPARATUSES, SYSTEMS, AND METHODS

RELATED APPLICATION

The present application claims priority to U.S. Provisional Patent Application No. 62/304,655, filed on Mar. 7, 2016, entitled "MODULAR INTERFACE OF INTELLIGENT LIGHTING CONTROL APPARATUSES, SYSTEMS, AND METHODS," which application is incorporated herein by reference in its entirety.

TECHNICAL FIELD

The present application relates generally to the field of lighting control systems.

BACKGROUND

Customizing and automating home lighting control devices is often epitomized by the installation of unsightly lighting switches that are inundated with light switches confusingly mapped to respective fixtures. Automated home lighting control systems can also include large, complex, expensive central hubs that require expert or skilled technicians for installation and/or operation. Smart light bulbs and/or Wi-Fi enabled lightbulbs introduced into any of these contexts or even in simpler ones can disadvantageously be limited by the light switch that it is associated with and/or the lighting fixture itself. For example, if a light switch associated with a smart light bulb is switched off the smart light bulb becomes inoperable.

Integration of an intelligent light switch into an existing wall electrical box generally requires interfacing with high powered electrical wires, such as wires providing voltages on the order of 110 volts or higher. Accordingly, as new advances or features of the intelligent light switch become available, upgrading the switch may warrant removal of the existing switch and interfacing with the high powered electrical wires upon each upgrade or change.

SUMMARY

The inventors have appreciated that various embodiments disclosed herein provide a modular interface to limit installation complexity and to facilitate easy upgrades and implementation of advanced features in intelligent lighting control systems.

Various embodiments provide lighting control systems.

In particular embodiments, a lighting control system includes a light switch module including a light switch actuator. The light switch module includes an actuator circuit board system coupled to the light switch actuator. The light switch actuator is configured to move with respect to the actuator circuit board system. The actuator circuit board system includes a low power circuit electrically connected to a low power circuit electrical connector. The low power circuit includes at least one processor. The light switch module includes a tactile display housed in the light switch actuator and electrically coupled to the at least one processor. The lighting control system also includes a light switch base module including a base housing forming a well configured to receive, at least in part, the actuator circuit board. The well includes a high power circuit electrical connector for sinking and sourcing high in-line power from and to an electrical wall box. The high power circuit electrical connector is configured to engage the low power circuit electrical connector. The high power circuit electrical connector is electrically connected to a high power circuit board housed in the base housing. The high power circuit board includes a voltage reducer.

In particular embodiments, the actuator circuit board system includes a circuit board stack.

In particular embodiments, the circuit board stack includes a dual board stack.

In particular embodiments, the high power circuit includes a combination of high and low power components.

In particular embodiments, the high power circuit comprises at least one of a transformer for power conversion to source the light switch module, a current meter, a voltage meter, a micro-controller, a noise filter, a power buffer, a plurality of mosfets for dimming, a triac for dimming, a multi-pin connector, a multi-blade connector, an AC/DC converter, an eeprom, a USB port for diagnostics, and an air-gap switch. The air gap switch is configured to provide a mechanical gate in a path of a line-in source that springs open when the light switch module is removed from the base module.

In particular embodiments, the low power circuit includes at least one of a microcontroller, a wireless radio, a wireless amplifier, a USB port for diagnostics, a DC/DC converter, an ambient light sensor, a near-field proximity sensor, a far-field occupancy sensor, a time-of-flight proximity sensor, a secure eeprom, a rechargeable battery, and a touch display.

In particular embodiments, the low power circuit is electrically connected to a rechargeable battery that is electrically connected to the low power circuit electrical connector.

In particular embodiments, the wireless radio includes at least one of a Wi-Fi radio, a Bluetooth radio and an 802.15.4 radio.

In particular embodiments, the lighting control system includes a wall plate configured to be coupled to a front of the light switch base module and surround the body of light switch actuator.

In particular embodiments, the light switch actuator module is removably coupled to the light switch base module.

In particular embodiments, the light switch actuator module includes a tactile display coupled to the actuator circuit board and operable through the light switch actuator.

In particular embodiments, the light switch actuator is composed, at least in part, of glass.

In particular embodiments, the voltage reducer includes at least one of a transformer, a relay, a thyristor, a resistor, and a capacitor.

In particular embodiments, the light switch actuator is configured to pivot with respect to the actuator circuit board.

In particular embodiments, the light switch actuator is configured to pivot with respect to the light switch base module.

In particular embodiments, the light switch module includes an antenna electrically coupled to the actuator circuit board.

In particular embodiments, the low power circuit includes a transceiver.

In particular embodiments, the low power circuit includes a Bluetooth module.

In particular embodiments, the low power circuit includes an 802.15.4 module.

In particular embodiments, the high power circuit includes a programmable logic controller (PLC) module.

In particular embodiments, the low power circuit includes a Wi-Fi module.

In particular embodiments, the low power circuit includes a first processor and the high power circuit includes a second processor.

In particular embodiments, at least one of the first processor and the second processor includes a digital lock and the other one of the first processor and the second processor includes a digital key, the digital lock and the digital key configured to engage one another in response to the light switch module being electrically coupled to the light switch base module to permit the low power circuit to control the high power circuit and to permit the high power circuit to continue powering the low power circuit.

In particular embodiments, the base module includes a power source terminal, a power sink terminal, and a ground terminal.

In particular embodiments, the light switch actuator includes an electrical contact component. The light switch actuator is configured to move the electrical contact component from a first position to a second position to connect an electrical flow path by movement of an actuation surface of the light switch actuator. The tactile display housed in the light switch actuator is configured for activation by movement of the actuation surface moving the electrical contact component to the second position. The tactile display is configured to move contemporaneously with the actuation surface. The tactile display is configured to cause selection of a lighting setting selected from a plurality of lighting settings in response to one or more tactile motions on the actuation surface. The tactile display is configured to discretely display a distinct icon in response to a change in the selection of the lighting setting.

Various embodiments provide methods of operating a lighting control system.

In particular embodiments, the method of operating a lighting control system includes receiving power in a base module. The base module includes a base housing forming a well. The well includes a high power circuit electrical connector electrically connected to a high power circuit board housed in the base housing. The high power circuit board includes a voltage reducer. The method includes reducing a voltage of the power in the base module. The method includes coupling a light switch module to the base module. The light switch module includes a light switch actuator coupled to an actuator circuit board. The light switch actuator is configured to move with respect to the actuator circuit board. The actuator circuit board includes a low power circuit including at least one processor. The at least one processor is electrically coupled to a tactile display housed in the light switch actuator. The low power circuit is electrically connected to a battery that is electrically connected to a low power circuit electrical connector configured to engage the high power circuit electrically connector. The method includes transmitting the power, at least in part, at the reduced voltage, from the base module to the light switch module. The method includes identifying, via the light switch actuator, a lighting profile selected from among a plurality of lighting profiles. The method includes transmitting power data from the light switch module to the base module based on the selected lighting profile. The power data is transmitted via the low power circuit electrical connector and the high power circuit electrical connector. The method also includes transmitting power from the base module to a light fixture based on the power data.

In particular embodiments, at least one of the high power circuit board and the low power circuit board include a circuit board stack.

In particular embodiments, the method includes initiating an unlocking protocol in response to coupling the light switch module to the base module.

In particular embodiments, the method includes digitally unlocking a digital lock in the base module via a digital key stored in a memory coupled to the processor in the light switch module.

In particular embodiments, the method includes digitally disabling the base module and the low power provided from the high power circuit electrical connector via a digital key stored in a memory coupled to the processor in the light switch module.

In particular embodiments, identifying a lighting profile includes at least one of moving the light switch actuator with respect to the actuator circuit board and activating the tactile display electrically coupled to the actuator circuit board via movement of the light switch actuator.

In particular embodiments, identifying a lighting profile includes providing a command to the light switch actuator remotely over a wireless network.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 2B and 2C illustrate multi-switch lighting control devices.

FIG. 8 is a flow diagram illustrating operation of a lighting control device.

FIG. 9 is a flow diagram illustrating installation of a modular lighting control device.

The features and advantages of the inventive subject matter disclosed herein will become more apparent from the detailed description set forth below when taken in conjunction with the drawings.

DETAILED DESCRIPTION

Following below are more detailed descriptions of various concepts related to, and exemplary embodiments of, inventive systems, methods and components of lighting control devices.

Figure 1A:
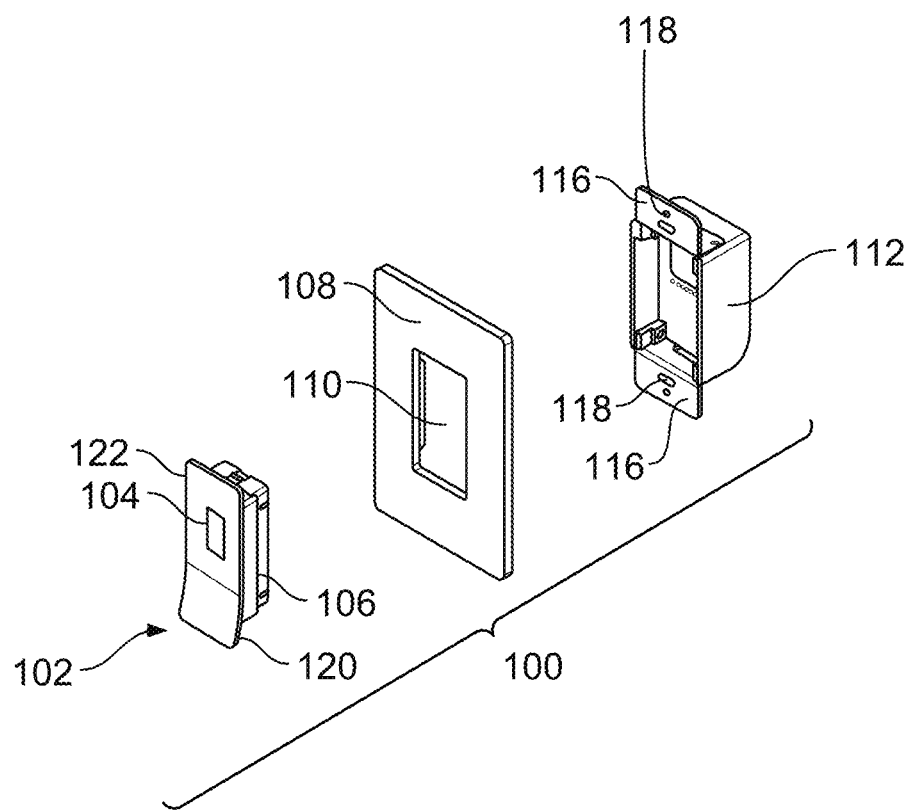
FIG. 1A is a perspective partially exploded view of a lighting control device.

FIG. 1A is a perspective partially exploded view of a lighting control device 100. The lighting control device (or lighting control system) 100 includes a switch module 102 including a light switch actuator 106 and a tactile display 104 housed in the light switch actuator 106. The lighting control device 100 also includes a wall plate cover 108 including a switch module opening 110 extending there through. The lighting control device 100 also includes a base module 112 configured for coupling to the switch module 102 via multi-pin or multi-blade socket 114. The base module 112 is sized and configured for receipt within a one-gang wall electrical box and has a volume corresponding substantially thereto. The base module 112 is configured to be coupled to a wall electrical box via connection tabs 116 and fastener apertures 118 in the connection tabs 116.

The light switch actuator 106 includes an outer actuation surface 122, which as discussed further herein may be composed of glass. The actuation surface 122 is movable, for example, by pushing on the curved foot 120 to cause the light switch actuator 106 to pivot, for example. The pivoting of the light switch actuator 106 and the actuation surface 122 causes a contact component (component 128 shown in FIG. 2) of the switch actuator 106 to move from a first position to a second position. Movement of the contact component causes a connection of an electrical flow path, for example by allowing two electrical contacts to connect or by connecting the contact component with an electrical contact. The connecting of the electrical flow path, permits electrical energy supplied by a power source connected to the base module 112 to energize or activate the tactile display 104, as discussed in further detail herein. The tactile display 104 is structured in the switch module to move contemporaneously with at least a portion of the actuation surface 122 and with the actuator 106. When activated or energized, the tactile display 104 allows a user to define or select predefined lighting settings where the lighting settings change the voltage or power supplied to one or more light fixtures connected to the lighting control device 100. The change in power supplied to the light fixture(s) may include a plurality of different voltages supplied to each fixture and may be based on various parameters including, but not limited to, location, light intensity, light color, type of bulb, type of light, ambient light levels, time of day, kind of activity, room temperature, noise level, energy costs, user proximity, user identity, or various other parameters which may be specified or detected. Furthermore, the lighting control device 100 may be connected to all of the light fixtures in a room or even in a house and can be configured to operate cooperatively with one or more other lighting control devices 100 located in a unit or room and connected to the same or distinct lighting fixtures.

Figure 1B:
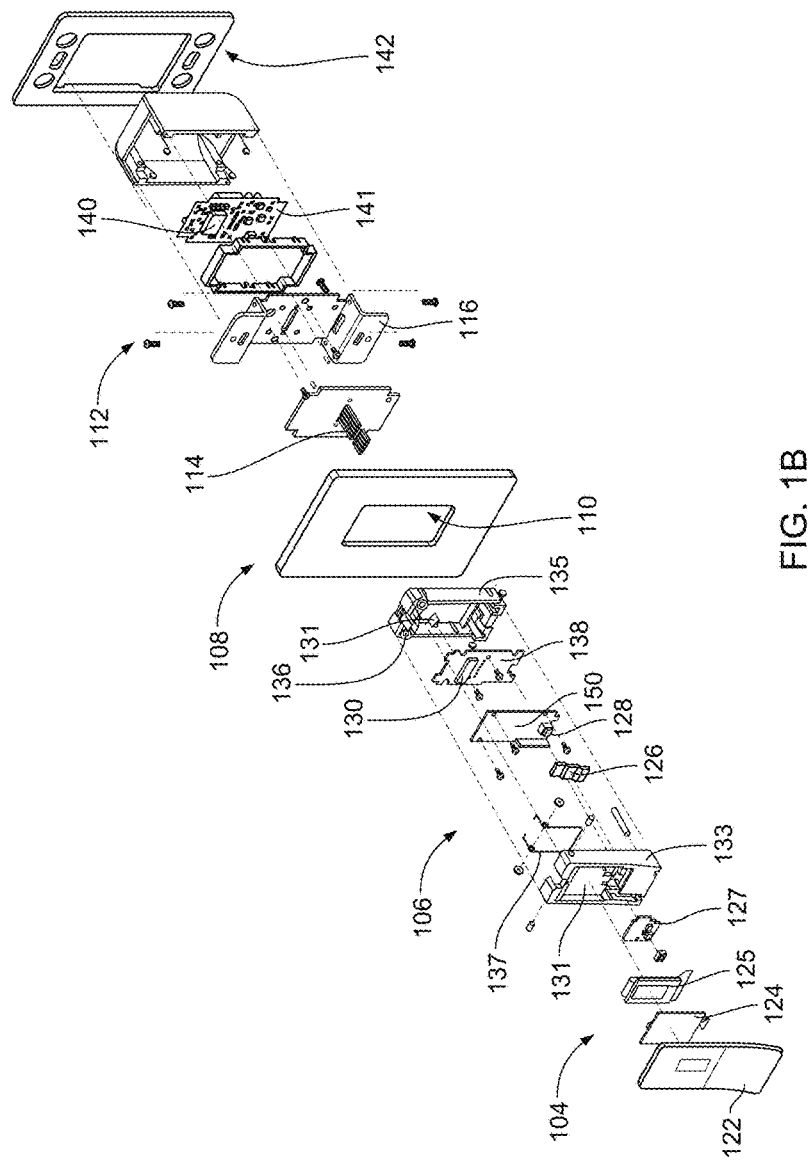
FIG. 1B is a fully exploded view of the lighting control device of FIG. 1A

FIG. 1B is a fully exploded view of the lighting control device 100 of FIG. 1A. As demonstrated in FIG. 1B, the tactile display 104 is positioned between the outer actuation surface 122 and a portion of the light switch actuator 106 (e.g., a housing portion of the light switch actuator). The actuation surface 122 may be composed of an impact-resistant glass material permitting light from the tactile display 104 and/or a clear sight of path for sensors (e.g., light sensors) 127 or other lights, such as a light from light pipe 126, which can indicate activation of the tactile display, to pass through the actuation surface 122. The tactile display 104 is composed of a polymer-based capacitive touch layer 124 and a light emitting diode panel 125, which are controlled via one or more modules or processors positioned on the printed circuit board 129. The one or more modules or processors positioned on the printed circuit board can be communicably coupled to the tactile display to cause implementation of a lighting setting stored on a memory device of the processor or coupled to the processor in response to a user selecting the lighting setting via the tactile display. The tactile display 104 is housed within a recess 131 of the light switch actuator 106 beneath the actuation surface 122. The light switch actuator 106 may comprise a thermoplastic housing including a housing cover 133 and a housing base 135. The light switch actuator housing cover 133 is pivotally connected to the housing base 135 via pins 136 and the housing cover 133 is biased with respect the housing base 135 via torsion spring 137. In particular embodiments, the light switch actuator housing cover 133 may be configured to slide or otherwise translate or rotate. The outer actuation surface 122 is biased with the switch actuator housing cover 133 and moves contemporaneously therewith in concert with the tactile display 104 housed in the cover component 133 of the light switch actuator 106. In particular embodiments, the outer actuation surface and/or the light switch actuator 106 are configured to move with respect to the tactile display 104 (e.g. to slide with respect to the tactile display). The light switch actuator 106 includes an electrical contact component structured as a switch pin 128 that is movable between positions to close an open circuit on the primary printed circuit board substrate 150, which board also houses a switch controller or processor. In certain embodiments the light switch actuator 106 can be configured to move other types of electrical contact components, for example by sliding. In certain embodiments the light switch actuator 106 may include a circuit board stack, including the primary printed circuit board substrate 150 and a secondary printed circuit board 138 The light switch actuator 106 may include a latch 136 for coupling to the base module 112 (e.g. as the light switch actuator 106 is passed through the opening 110 in the wall plate cover 108), which latch causes the light switch actuator 106 to click into place. The housing base 135 includes a multi-pin connector or plug 134 configured to engage the multi-pin socket 114 of the base module 112.

The lighting control device 100 includes a mounting chassis 142 configured to be installed to an electrical wall box. The mounting chassis 142 creates an even surface for installation of the other modules (e.g., the base module 112 and the switch module 102). Once the base module is connected to the electrical wall box via the mounting chassis 142, the wall plate cover 108 can be coupled to the mounting chassis 142 and the light switch actuator 106 can be inserted through the switch module opening 110. In particular embodiments, the wall plate cover can be coupled to the mounting chassis 142 and/or the tabs 116 of the base module via magnets. The magnets may be recessed within openings of a portion of the wall plate cover 108. As noted, the base module 112 is configured to be coupled to the mounting chassis 142 via connection tabs 116. The base module 112 is further configured to be electrically coupled to a power source (e.g., an electrical wire coming from an electrical breaker box to the electrical wall box) and to one or more light fixtures wired to the electrical box. Accordingly, the base module 112 provides an interface between a power source, the light switch actuator 106, and one or more light fixtures. The base module includes a processor 140 and a circuit board 141 for managing the power supplied by the power source and routed to the one or more light fixtures in accordance with a light setting selection identified via the light switch actuator 106 or the tactile display 104.

One or more of the processor on the printed circuit board 150 or 138 and the base module processor 140 may include wireless links for communication (directly or indirectly, e.g., via the internet) with one or more remote electronic device such as a mobile phone, a tablet, a laptop, another mobile computing device, one or more other lighting control devices 100 or other electronic devices operating in a location. In certain implementations the wireless links permit communication (directly or indirectly, e.g., via the internet) with one or more devices including, but not limited to smart light bulbs, thermostats, garage door openers, door locks, remote controls, televisions, security systems, security cameras, smoke detectors, video game consoles, robotic systems, or other communication enabled sensing and/or actuation devices or appliances. The wireless links may include BLUETOOTH classes, Wi-Fi, Bluetooth-low-energy, also known as BLE (BLE and BT classic are completely different protocols that just share the branding), 802.15.4, Worldwide Interoperability for Microwave Access (WiMAX), an infrared channel or satellite band. The wireless links may also include any cellular network standards used to communicate among mobile devices, including, but not limited to, standards that qualify as 1G, 2G, 3G, or 4G. The network standards may qualify as one or more generation of mobile telecommunication standards by fulfilling a specification or standards such as the specifications maintained by International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, LTE, LTE Advanced, Mobile WiMAX, and WiMAX-Advanced. Cellular network standards may use various channel access methods e.g. FDMA, TDMA, CDMA, or SDMA. In some embodiments, different types of data may be transmitted via different links and standards. In other embodiments, the same types of data may be transmitted via different links and standards.

Figure 2A:
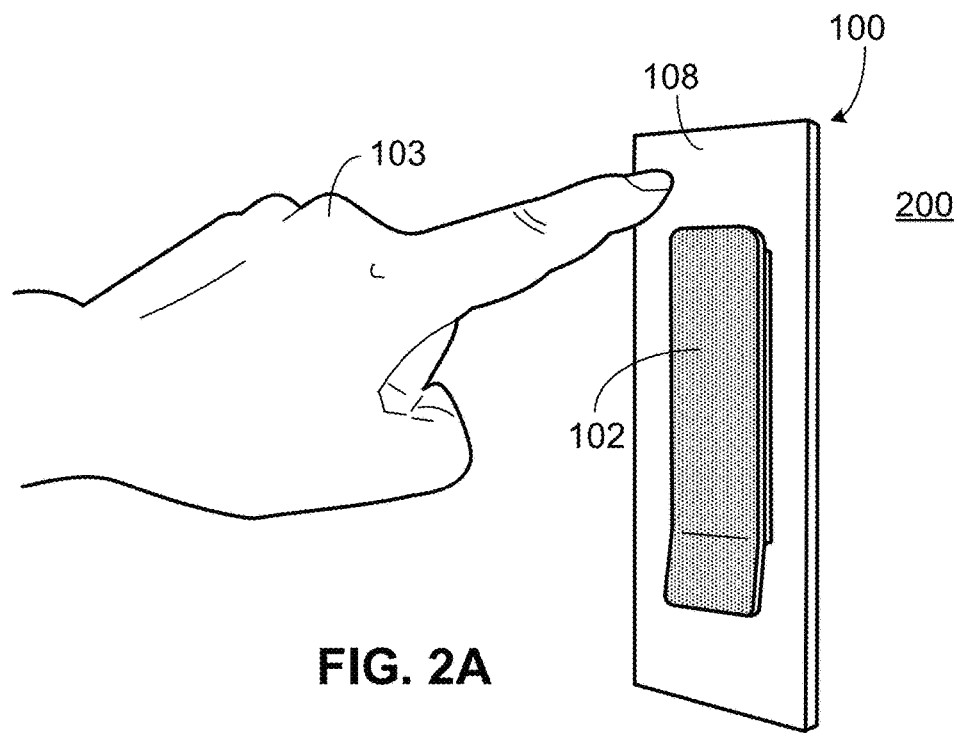
FIG. 2A shows the lighting control device of FIG. 1A mounted on a wall.

FIG. 2A shows the lighting control device 100 of FIG. 1A mounted on a wall 200. As demonstrated in FIG. 2A, the base module 112 is not visible upon installation of the lighting control device 100 in view of the wall plate cover 108. Because the wall plate cover 108 attaches to the base module 112, the wall plate cover 108 appears to be floating on the wall 200. The lighting control device 100 may be activated by a user 103 interacting with the outer actuation surface 122 and the tactile display 104.

Figure 2B:
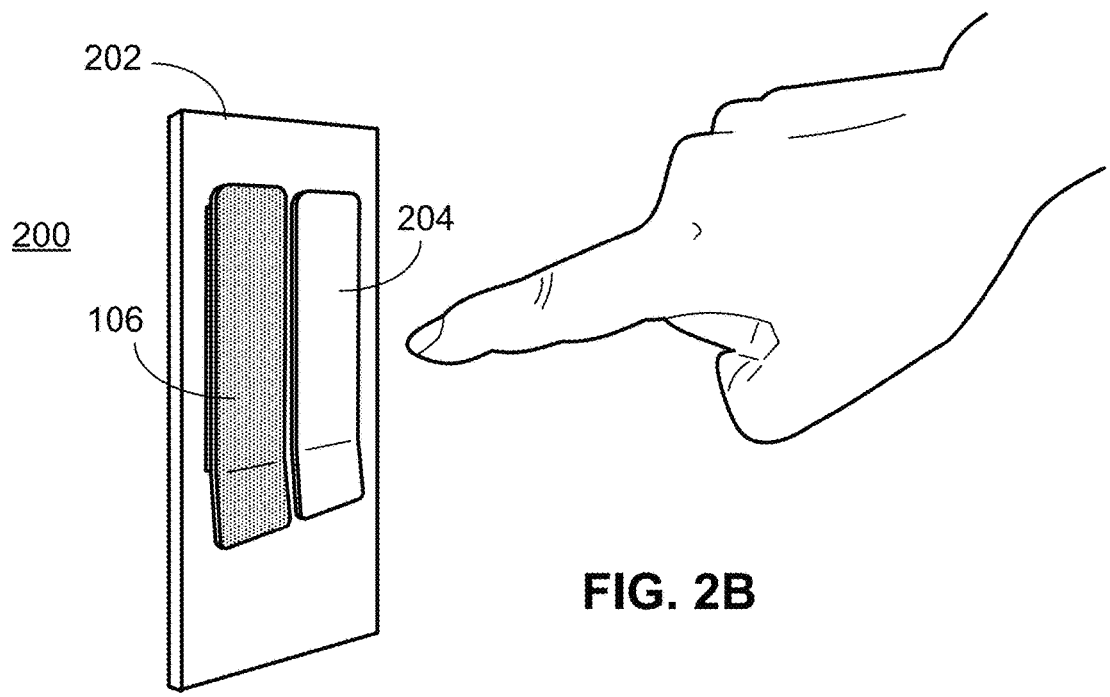

FIGS. 2B and 2C illustrate multi-switch configurations of multiple lighting control device. FIGS. 2B and 2C illustrate a two switch and three switch embodiment respectively where the lighting control devices 202 and 203 each include a light switch actuator 106 as well as auxiliary switches 204 and 208, as well as 2 and 3 base modules 112, respectively.

FIGS. 3A-3F illustrate a lighting control device transitioning through various lighting settings and a room having lighting fixtures controlled by the lighting control device.

Figure 3A:
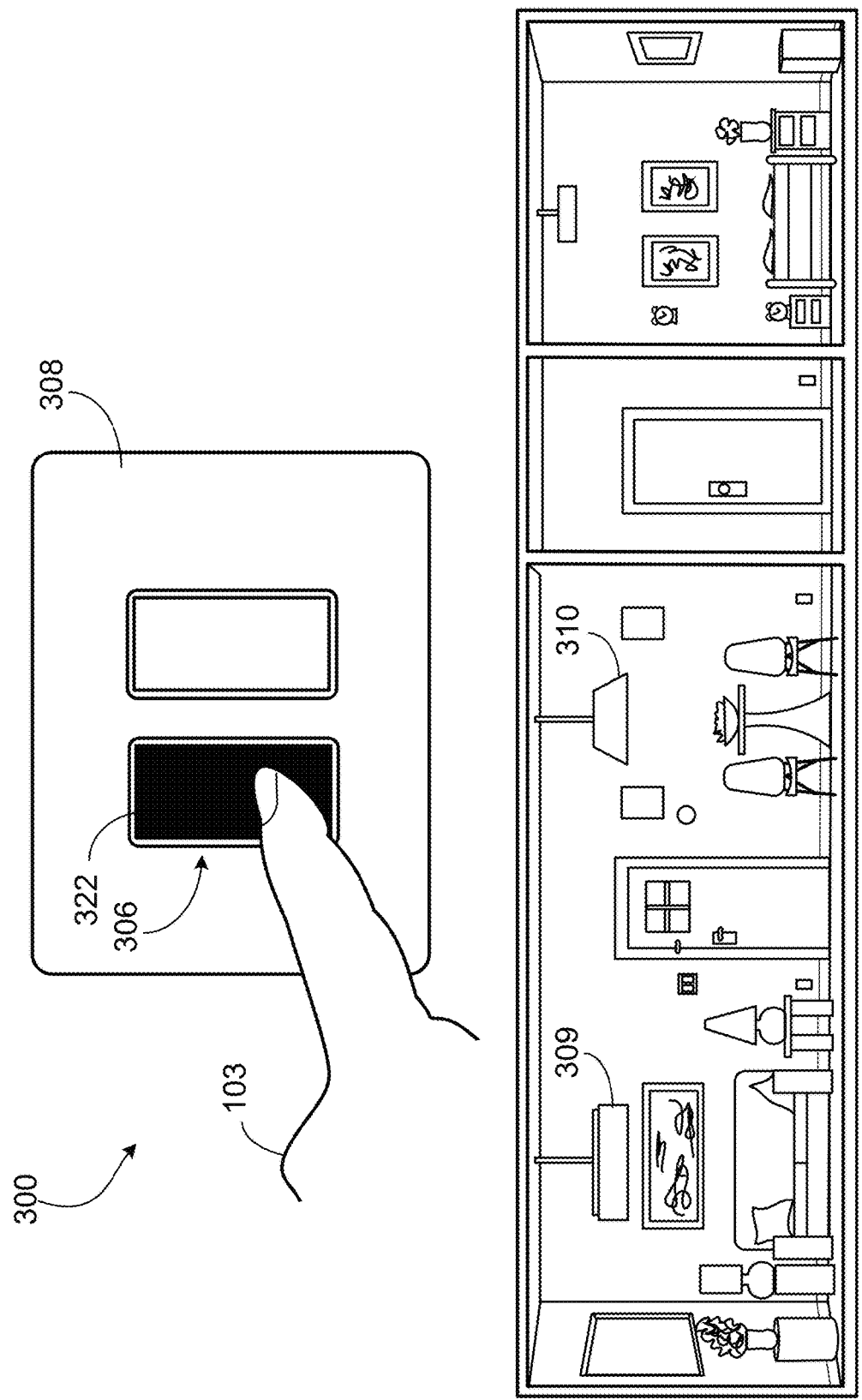
FIGS. 3A-3F illustrate a lighting control device transitioning through various lighting settings and a room having lighting fixtures controlled by the lighting control device.
Figure 3B:
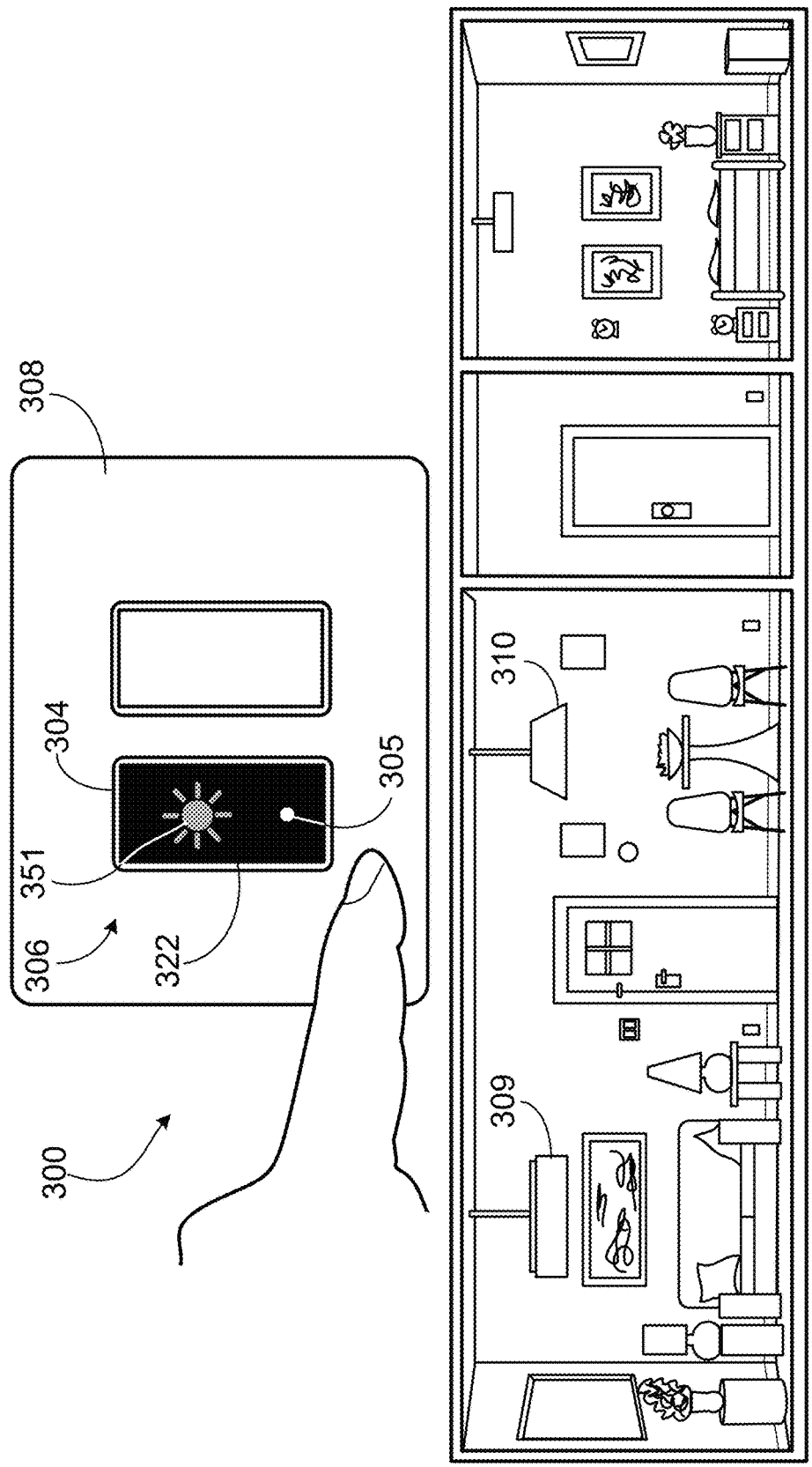
Figure 3C:
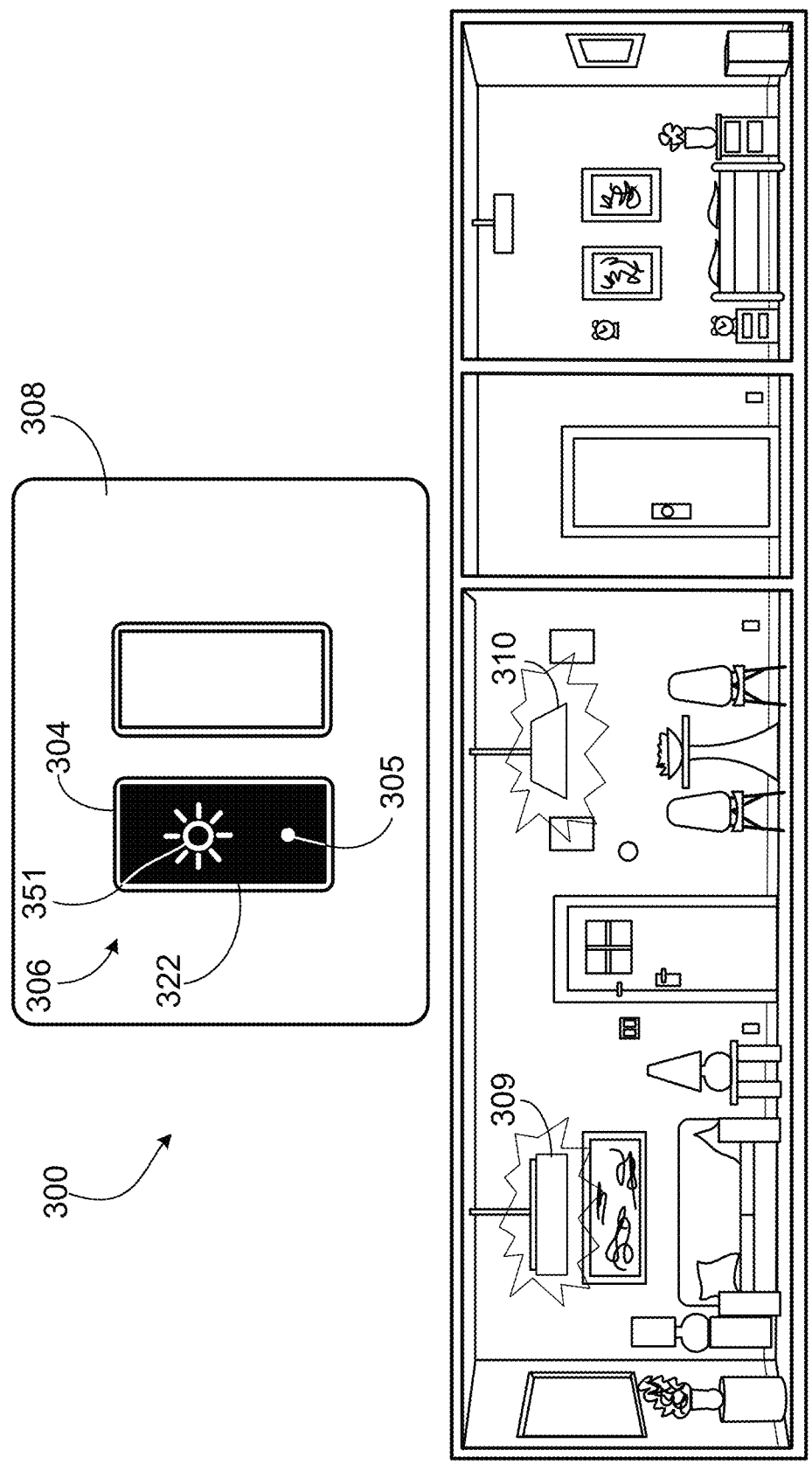
Figure 3D:
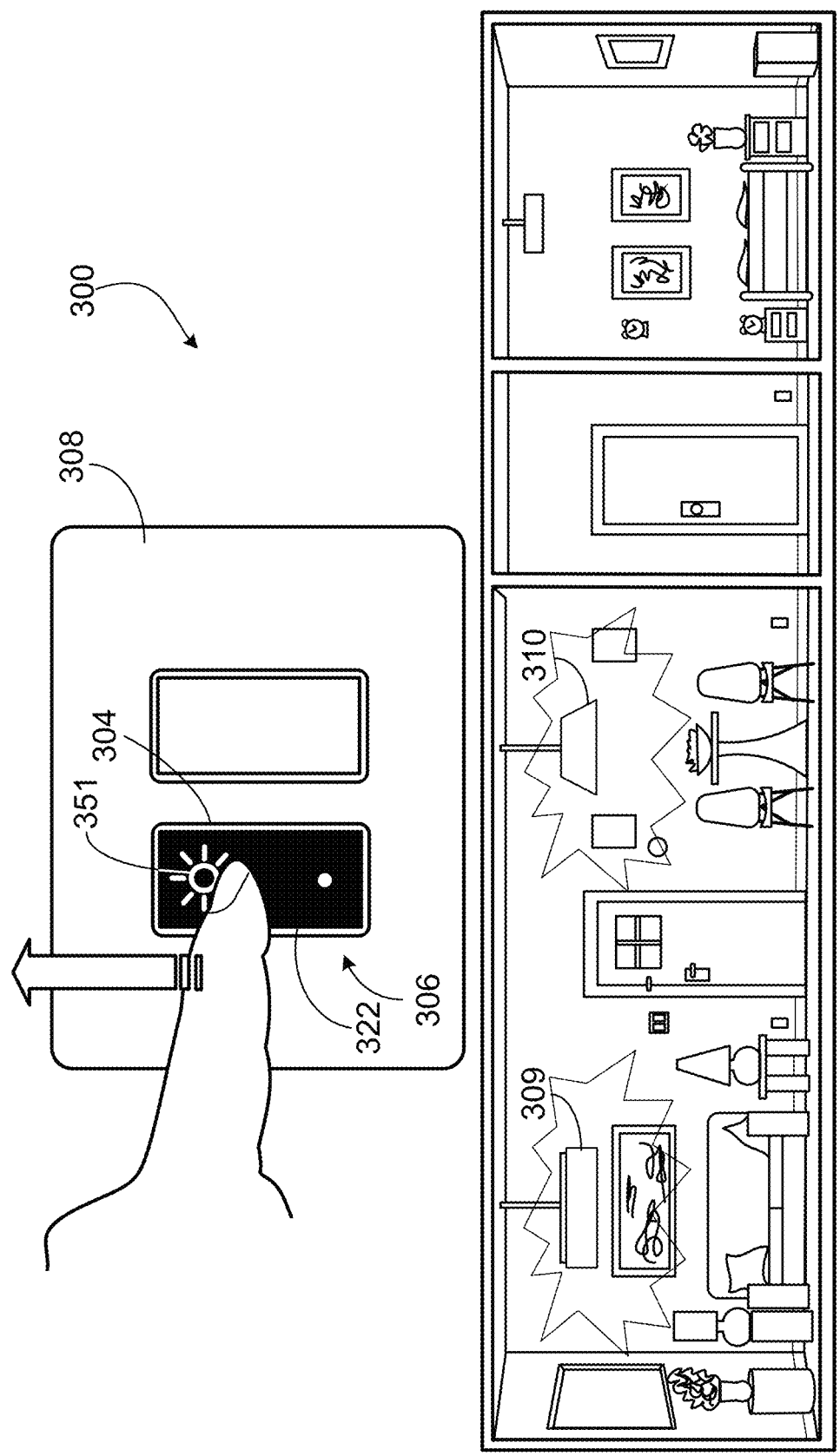
Figure 3E:
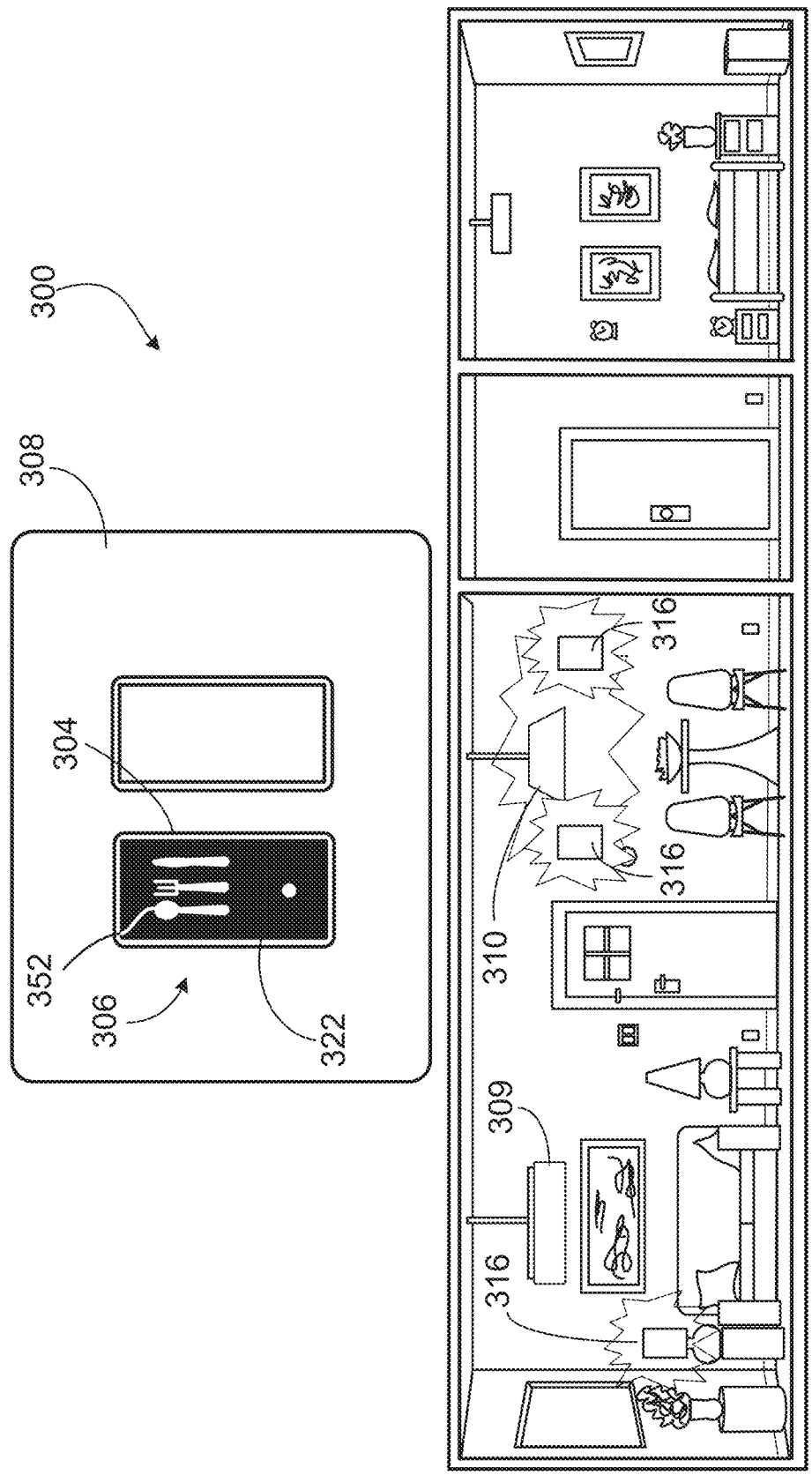
Figure 3F:
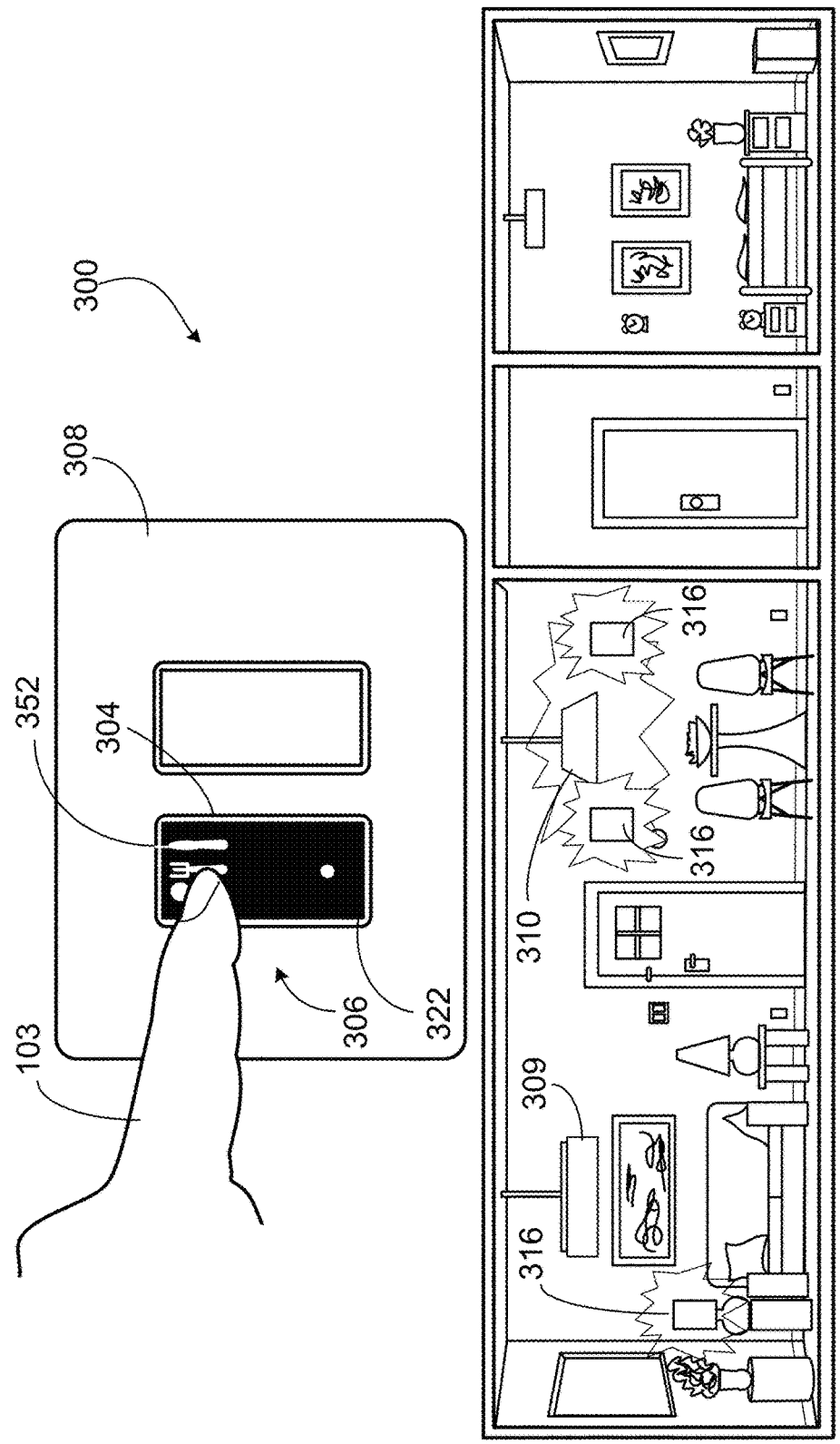

In FIG. 3A, the lighting control device 300 is connected to a base module positioned behind the wall plate 308. The lighting control device 300 includes a dynamic light switch actuator 306, operable in a manner similar to the light switch actuator discussed in connection with FIGS. 1A-2C, and an auxiliary light switch actuator. As demonstrated in FIG. 3A by the unilluminated outer actuation surface 322 of the light switch actuator 306 is inactive and not energized. In response to a user 103 moving the actuation surface 322 of the light switch actuator 306 (e.g., pivoting the actuation surface), the light switch actuator 306 begins to become energized, as shown in FIG. 3B. The energization or activation of the light switch actuator 306 is signaled by the power light indicator 305 and by full lighting setting icon 351. As shown in FIG. 3C where the icon 351 is fully lit (rather than partially lit as in FIG. 3B), the light switch actuator 306 is fully energized. In this particular configuration, the primary lights 309 and 310 are illuminated at full power. FIG. 3D shows the transition between lighting settings. As demonstrated in FIG. 3D, this transition is facilitated via user 103 completing swiping gesture 312 across the tactile display 304 and along the actuation surface 322. As the user completes the gesture 312, the icon 351 is swiped from the tactile display 304 as the tactile display toggles, moves, switches to, or selects a new light setting shown in FIG. 3E. The new light setting shown in FIG. 3E is represented or identified by the dinner icon 352. The new light setting shown in FIG. 3 has the light fixture 309 powered down and has caused lamp 316 and sconces 318 to become illuminated to change the lighting scene in the room. The change in the light setting causes a change in distribution of power to certain lighting fixture based on the selected lighting setting. The light switch actuator 306 may be pre-programmed with a plurality of lighting settings or may be configured with particular lighting settings as specified by the user 103. A further swiping gesture 315 shown in FIG. 3F or a different gesture are used to transition from the lighting setting of FIG. 3F represented by icon 352 to a further lighting setting.

In particular embodiments, a lighting setting may include a fully off setting where the power is reduced so that the lighting fixtures aren't illuminated. In the fully off setting, the icon display can be off or indicative off an off state, while the power light indicator 305 remains illuminated to let the user know that the lighting control device 300 is in an activated or energized state. Accordingly, a user can turn off the light for a fixture that is connected to a smart bulb, but still retain the bulb in a state for activation remotely (e.g. for control via a mobile electronic device communicably coupled to the lighting control device 300) or locally, directly through the lighting control device 300.

Figure 4:
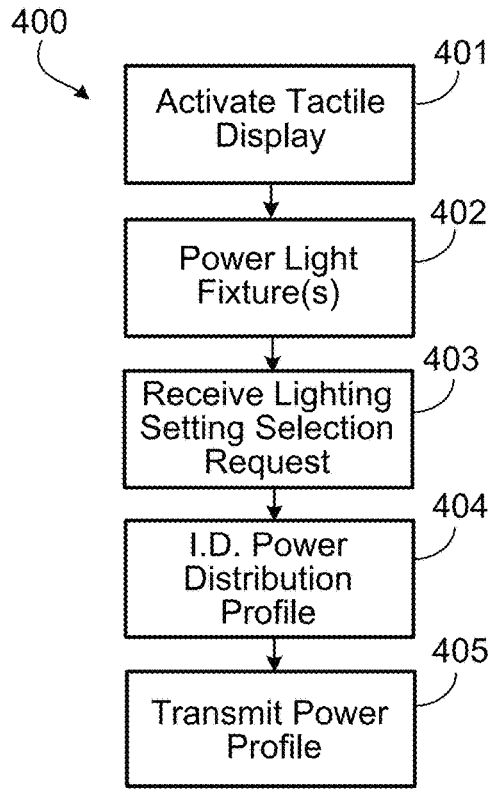
FIG. 4 provides a flow diagram of operations of a system for controlling a lighting control device.

FIG. 4 provides a flow diagram of operations of a system for controlling a lighting control device. FIG. 4 illustrates control operations of a control system, such as one or more processors 130 configured (e.g., programmed with computer program instructions, encoded on computer storage medium) to control the lighting control device 100 or 300, in accordance with various embodiments of the present invention. At 401, the tactile display housed in the light switch actuator is activated by moving the light switch actuator, for example by moving the actuation surface of the light switch actuator (e.g. pivotally moving the actuation surface). At 402, the light fixtures electrically coupled to the light switch actuator via a base module are powered as the movement of the light switch actuator causes a contact component to move into a new position and thereby permit or cause an electrical flow path between a power source and the light fixture(s) to be closed. The tactile display housed in the light switch actuator is moved contemporaneously with the actuation surface. At 403, a lighting setting selection request is received via the tactile display, for example by a particular tactile motion or motions (e.g., swipes, gestures, taps, etc.) on the tactile display (i.e. touch screen display). The lighting setting selection request identifies a distinct lighting setting from among a plurality of lighting settings. A user may swipe multiple times to move, switch, or toggle through the plurality of lighting settings to select a particular lighting setting, or the user may conduct a specific motion that corresponds to a particular lighting setting including, but not limited to, a half swipe and tap to achieve a light intensity of all the connected light fixtures at half of their peak output. The lighting settings identify distinct power distribution schemes (e.g. distinct pre-set or programmed dimming profiles) for one or more light fixtures connected to the light switch module, which distribution scheme is automatically initiated based on user selection. At 404, a power distribution scheme is identified. At 405, the identified power distribution scheme is transmitted, for example by the base module responding to control signals from the light switch actuator, to adjust one, some, or all of the lights based on the power distribution scheme corresponding to the lighting setting selected. The power distribution schemes or profiles may be stored in a memory device of the lighting control device or on a remote computing device communicably coupled to the lighting control device. In certain embodiments, the power distribution schemes may be adjusted to account for other parameters such as ambient lighting from natural light or an unconnected source. In certain embodiments the power distribution schemes may be adjusted based on one or more other sensor parameters. In particular embodiments, the lighting setting may be adjusted by automation based on time of day, sensed parameters such as light, temperature, noise, or activation of other devices including, but not limited to, any electronic device described herein.

Figure 5:
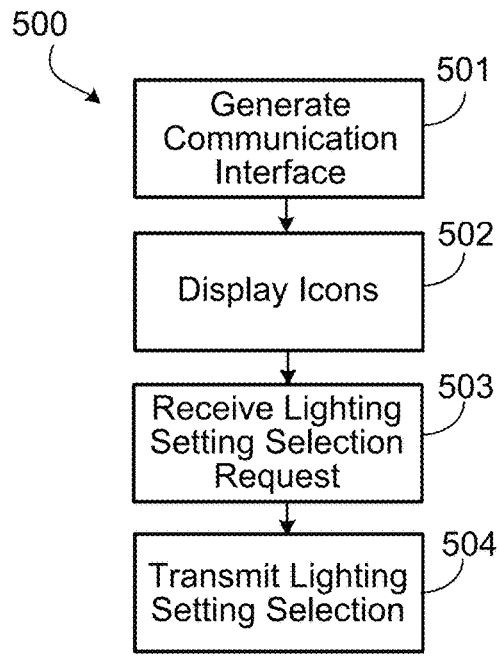
FIG. 5 shows a flow diagram of a system for remotely operating a lighting control device.

FIG. 5 shows a flow diagram of system for remotely operating a lighting control device. In particular embodiments, the lighting control device 100 or 300 may be operable from a remote device if the actuator switch is activated or energized. In such instances, the remote device may include one or more computer program applications, such as system 500, operating on the device to communicate with and control the lighting control device. Accordingly, at 501, the control system 500 initiates a connection module to generate a communication interface between a mobile electronic device and a light switch module. The connection module may cause the remote device to send one or more wireless transmission to the lighting control device via a communication protocol (e.g., Bluetooth). At 502, the control system 500 causes the remote device to generate a display of icons on a display device of the mobile electronic device to facilitate selection of a lighting setting. At 503, the control system 500 receives a lighting setting selection based on the user selecting a particular icon. At 504, a transmission module causes the lighting setting selected to be transmitted to the lighting control device so that the light switch module and/or the base module can cause the power distribution scheme corresponding to the lighting setting to be transmitted to the lighting fixtures. The tactile display of the lighting control device may be updated in concert with receipt of the lighting setting to display the icon selected on the mobile electronic device and corresponding to the lighting setting selected on the tactile device.

Figure 6:
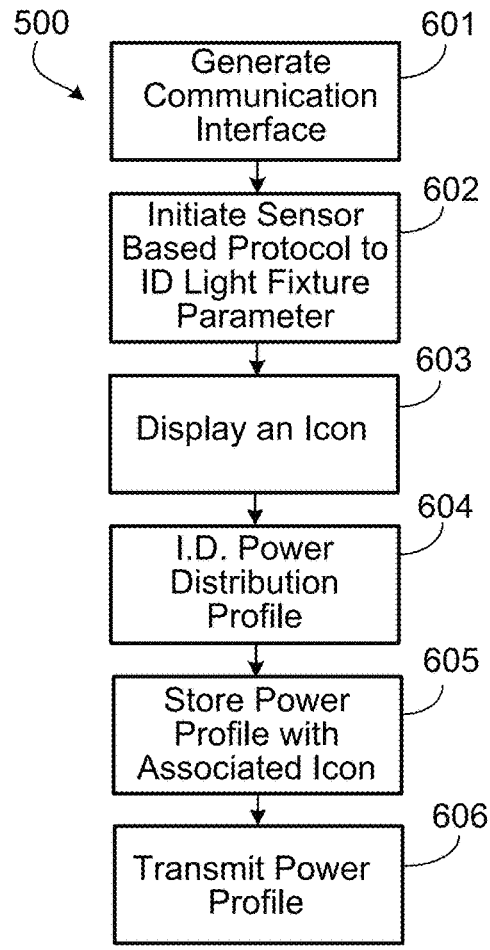
FIG. 6 illustrates a flow diagram of a system for remotely configuring operations of a lighting control device.

FIG. 6 illustrates a flow diagram of a system for remotely configuring operations of a lighting control device. The remote device may include devices including, but not limited to a mobile phone, a mobile computing device or a computing device remote from the light control device. At 601, the mobile electronic device generates a communication interface with the light switch module. At 602 a light fixture identification module initiates a sensor based protocol to identify a parameter associated with one or more light fixtures connected to the light switch control module. At 603, a display selection module causes a display of an icon to appear on a display device of the mobile electronic device. At 604, a lighting setting configuration module allows a user to create a power distribution scheme or profile for the light fixtures identified based on the identified parameters and a user specified input related to light intensity. At 604, a storage module is used to the store the power distribution scheme and associate a particular lighting setting icon with the power distribution scheme. At 605, a transmission module transmits the power distribution scheme and the associated icon to the light switch control module.

Figure 7:
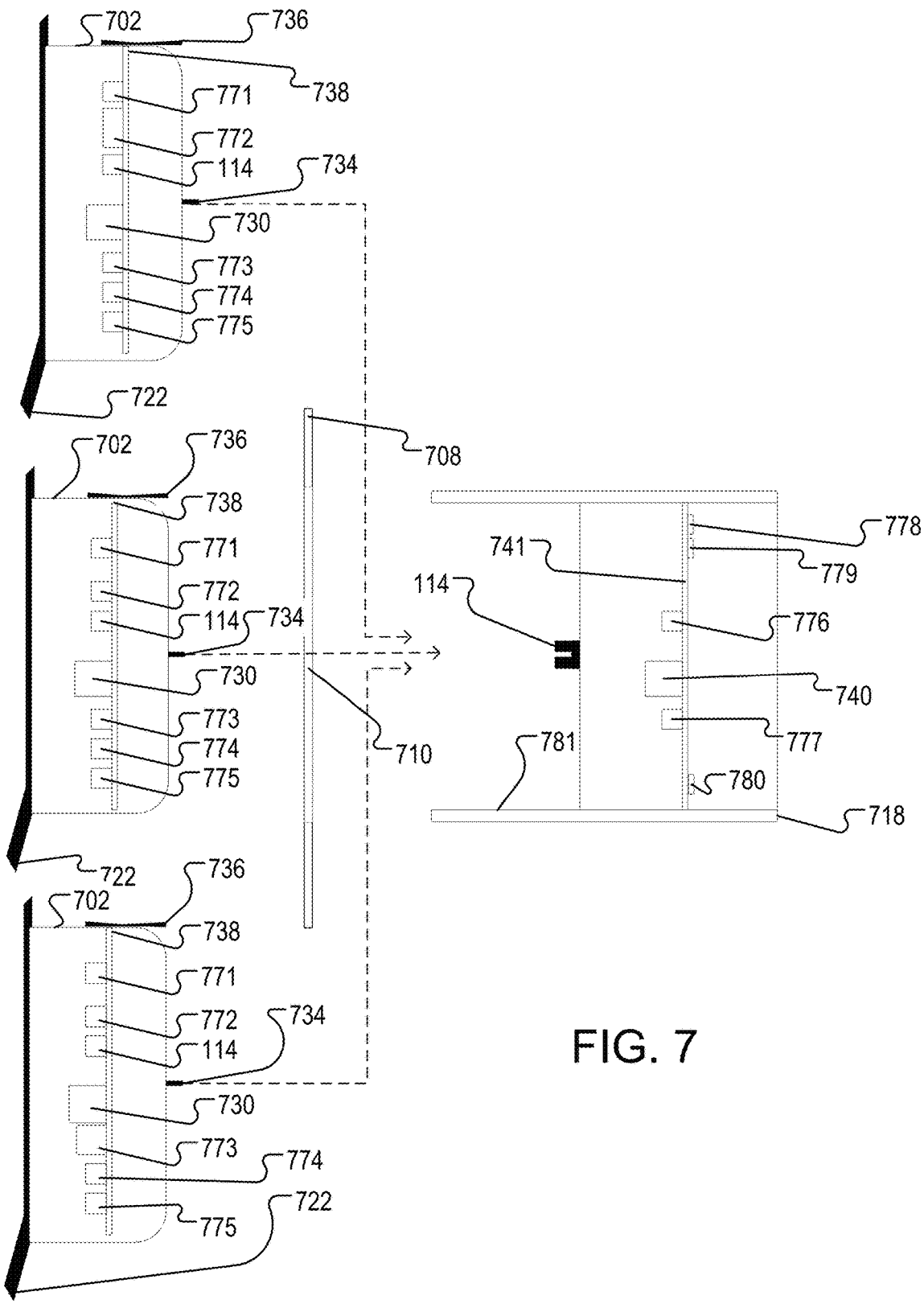
FIG. 7 is a schematic demonstrating the modular nature of a lighting control device.

FIG. 7 is a schematic demonstrating the modular nature of a lighting control device. A lighting control device implemented in accordance with particular embodiments disclosed herein can be configured to permit the switch module portion, such as portion 120, to be interchanged with another switch module, for example to provide a switch module with updated features, software, components, and/or functions without requiring any rewiring or direct contact with live electrical wires. Instead the lighting control device can be updated by removing the switch module portion from the base module and inserting a different switch module. FIG. 7 demonstrates the interchangeability, as switch module 736 can be removed from base module 718 and replaced with either on of switch modules 736*a* and 736*b* each of which has at least one unique component with respect to switch module 736. A switch module 736 may be removed independently/without the wall plate 708. To remove switch module 736, no additional mechanism or tool is required, instead the complete unit is released in a two-stage movement—up (e.g. to depress a spring load latch) and out. The switch module 736 may a hook-shaped male mechanical body that grabs a hold of the bottom edge on the female interface of the base module 718. The hook-shaped male mechanical body may be a part of a multi-pin connector 734.

The switch module 702 includes a digital printed circuit board 738 holding and connecting various electrical components forming a low power circuit (with respect to the high power circuit of the base module 718 discussed further herein) that controls the operation of a light fixture attached to the base module 718. The low power circuit includes at least one processor 730 (e.g., a microprocessor or programmable logic controller (PLC)). The at least one processor 730 is configured to receive a power signal and control a tactile display on an actuation surface 722 based on receipt of the power signal and inputs from a user. The actuation surface 722 is configured to move (e.g., pivot) with respect to at least a portion of the switch module (such as a base housing portion of the switch module housing) and/or the digital printed circuit board 738. The actuation surface 722 can move along another portion of the switch module housing (e.g. with the actuator housing cover) In particular, the processor 730 identifies a lighting profile or lighting setting from among a plurality of lighting profiles in response to an input from a user and sends lighting control signals to the base module 718 based thereon. The lighting profiles or lighting profile library are stored on a memory device, such as memory 774 accessible via the processor 730. The low power circuit includes a sensor module 773, in certain embodiments. The sensor module 773 is configured to detect one or more physical characteristics which may be used to modify or select a lighting profile and/or to customize other operating characteristics of the switch module 702. The sensor module 773 may include one sensor or multiple sensors or may include a particular sensor, which can include an optical sensor (which can be configured to detect color and/or intensity of light), a microphone, a camera, a temperature sensor, a motion detector, a radio frequency sensor, and/or a timer or digital clock. The low power circuit also includes a transceiver 775 (and or a transmitter and receiver capable of being communicably coupled or operated independently, but connected to the processor 730), in particular embodiments. The transceiver 775 may be configured to transmit or detect various radio signals wirelessly. The low power circuit also includes a touch screen controller 770 communicably coupled to a tactile display accessible via the actuation surface 722. The low power circuit also includes an analog to digital converter 771, in particular embodiments. The low power circuit also includes a power management module 772 for controlling the power received and transmitted by the switch module 702.

The components of the low power circuit are connected to the digital PCB 738 which is electrically connected to the multi-pin connector 734 to transmit electrical signals from the switch module 702 to the base module 718. The switch module 702*a*, demonstrates an example of a switch module that may be exchanged for the switch module 702. The switch module 702*a* includes a digital PCB 738 that includes a unique power management module 772*a*. The power management module 772*b* may be distinguished from the power management module 772 in that the module 772 may be configured to operate light fixtures under special energy efficient parameters and may thus have distinct lighting profile and related lighting icons associated with the switch module 702*a*.

The switch module 702*b* includes a sensor module 773*b* that is configured for processing images from a camera integrated in the actuation surface 722*b*. For example, some switch modules 702*b* may be configured without a camera while others may include a camera. The modular interface presented by embodiments disclosed herein will allow a user to quickly and easily switch between modules depending on preference and functional needs. In particular, the base module 718 can remain attached to the wiring in the electrical wall box while a user switches between switch modules 702, 702*a*, and 702*b*. The features that distinguish between the switch modules 702, 702*a*, and 702*b* are provided as exemplary examples and are not exhaustive. Other options, such as switches with the same features and simply having an upgraded processor may be implemented in accordance with inventive embodiments disclosed herein.

Any one of the switch modules 702, 702*a*, and 702*b* may be operated with the base module 718. For use one of the switch modules 702, 702*a*, and 702*b* is inserted through (or removed from) the opening 710 through the wall plate cover 708. The switch module inserted is positioned in the well 781 created by wall portions of the housing of the base module 718. The switch module can be coupled to the base module 718 via a module interface integrated with the multi-pin connector 714. The multi-pin connector 714 is configured to engage the multi-pin connector 734 of the switch module upon insertion of the switch module in the well 781. In certain embodiments, the connection of the multi-pin connectors 714 and 734 may close an open circuit in the base module to facilitate power transmission through the high power circuit of the base module 718 to provide additional safety and allow interchangeability of the switch modules without requiring disconnecting power to the base module 718.

As illustrated in FIG. 7, the base module includes a high power circuit on the printed circuit board 741 configured to receive and transmit power signals to a lighting fixture. The high power circuit also includes a processor 740. In particular embodiments, the processor 740 includes a digital lock configured to be unlocked by a digital key stored in the processor 730. The digital lock includes programmable instructions that can preclude the high power circuit from transmitting power to the low power circuit (e.g., after a pre-determined time-out period) in the light switch module once the base module and the light switch module are electrically connected via the multi-pin connector 734 and the multi-pin socket 114 of the base module if the digital key is not configured to unlock the digital lock. The digital key can include a passcode, a unique identification number, a serial number, or other sequence of characters or keys configured to permit unauthorized devices from operating with the base module, for example to prevent hazards that can occur from incompatible devices engaging the base module.

The high power circuit further includes a voltage reducer 776 to reduce the voltage of the current transmitted from a power line to the switch module via the multi-pin connector. The PCB 741 can be configured to handle higher voltages than PCB 738, in particular embodiments. The voltage reducer can include a transformer, a resistor, a capacitor, a relay (such as an adjustable solid state relay), and/or thyristor (such as a bi-direction triode thyristor). In general, the voltage from the power line can be a high voltage such as a 110 volt transmission or higher (e.g. 127 volts, 220 volts, or 240 volts). The voltage reducer 776 reduces the 110-volt signal to a lower voltage (e.g., less than 10 volts, 5 volts, 2 volts, or 1 volt) for powering the switch module (702, 702*a*, or 702*b*). The high power circuit further includes a power management module 776, and terminals 778, 779, 780 for connecting the base module 718 to one or more wires which can include a hot or power wire, a neutral wire, and/or a ground wire.

FIG. 8 is a flow diagram illustrating operation of a lighting control device. The operating scheme 800 is initiated at 801 by the base module receiving power (for example when the base module is connected to a live power wire at one or more terminals or via one or more wires connected to one or more power terminals. In certain embodiments, the base module may isolate power from the switch module until the switch is connected and/or actuated via the actuation surface 722. At 802, the base module reduces the voltage of the power. At least a portion of the power at the reduced voltage is transmitted to the light switch module, at 803, for example via the multi-pin connectors electrically connecting the switch module to the base module. The reduced voltage transmitted to the light switch module may be used to directly power the light switch module or charge a battery integrated into the light switch module. At 804, a light profile is identified from among a plurality of light profiles via the actuation surface 722. The light profiles may be stored on the memory 774 of the switch module and may be accessed by the microprocessor 730. The light profile desired can be identified, for example, by a user swiping along a surface of the actuation surface and thereby engaging a tactile interface connected to the low power circuit of the switch module 702. At 805, the microprocessor 730 causes power data to be transmitted from the switch module 702 to the base module 718 to cause the light fixtures connected to the base module 718 to receive particular voltages of power at particular times or rates that correlate to the selected light profile. At 806, the base module transmits power data to the light fixtures to execute the light profile based on the information received at the base module from the switch module based on the selected lighting profile.

FIG. 9 is a flow diagram illustrating installation of a modular lighting control device. Process 900 is initiated at 901 upon installation of the base module. At 901 the base module is connected to a power wire in a wall electrical box. The power wire may be connected to a terminal, connector, or wire of the base module 718. The wiring at 901 may also include connecting one or more neutral and/or ground wires. Once the base module is electrically connected, at 902 the base module is mounted to the wall electrical box, for example via fasteners such as screws. The base module 718 generally includes openings at a top and bottom of the switch. At 903, a wall plate is attached to the base module. As described herein, in particular embodiments, the wall plate includes magnets for attaching to the base module 718. Once the wall plate is installed, at 904, the switch module (e.g. 702) is inserted through the wall plate into the base module where the electrical connectors of the base module 718 and the switch module 702 engage and a coupling such as latch 736 help to fix the switch module in place through the wall plat and in the base module. Once physically and electrically connected, the actuation surface 722 of the switch module 702 is toggled at 905 to power the switch module 702 permitting light fixtures coupled to the base module 718 to be powered on or off or adjusted to distinct settings harmoniously upon the selection of a particularly lighting profile selected via the actuation surface 722.

Implementations of the subject matter and the operations described in this specification can be implemented by digital electronic circuitry, or via computer software, firmware, or hardware, including the structures disclosed in this specification and their structural equivalents, or in combinations of one or more of them. Implementations of the subject matter described in this specification can be implemented as one or more computer programs, i.e., one or more modules of computer program instructions, encoded on computer storage medium for execution by, or to control the operation of, data processing apparatus.

A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., a FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, implementations of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's user device in response to requests received from the web browser.

Implementations of the subject matter described in this specification can be implemented in a computing system that includes a back end component, e.g., as a data server, or that includes a middleware component, e.g., an application server, or that includes a front end component, e.g., a user computer having a graphical display or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The computing system can include users and servers. A user and server are generally remote from each other and typically interact through a communication network. The relationship of user and server arises by virtue of computer programs running on the respective computers and having a user-server relationship to each other. In some implementations, a server transmits data (e.g., an HTML page) to a user device (e.g., for purposes of displaying data to and receiving user input from a user interacting with the user device). Data generated at the user device (e.g., a result of the user interaction) can be received from the user device at the server.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

For the purpose of this disclosure, the term "coupled" means the joining of two members directly or indirectly to one another. Such joining may be stationary or moveable in nature. Such joining may be achieved with the two members or the two members and any additional intermediate members being integrally formed as a single unitary body with one another or with the two members or the two members and any additional intermediate members being attached to one another. Such joining may be permanent in nature or may be removable or releasable in nature.

It should be noted that the orientation of various elements may differ according to other exemplary implementations, and that such variations are intended to be encompassed by the present disclosure. It is recognized that features of the disclosed implementations can be incorporated into other disclosed implementations.

While various inventive implementations have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive implementations described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive implementations described herein. It is, therefore, to be understood that the foregoing implementations are presented by way of example only and that, within the scope of the appended claims and equivalents thereto, inventive implementations may be practiced otherwise than as specifically described and claimed. Inventive implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, the technology described herein may be embodied as a method, of which at least one example has been provided. The acts performed as part of the method may be ordered in any suitable way. Accordingly, implementations may be constructed in which acts are performed in an order different than illustrated, which may include performing some acts simultaneously, even though shown as sequential acts in illustrative implementations.

The claims should not be read as limited to the described order or elements unless stated to that effect. It should be understood that various changes in form and detail may be made by one of ordinary skill in the art without departing from the spirit and scope of the appended claims. All implementations that come within the spirit and scope of the following claims and equivalents thereto are claimed.

What is claimed is:

1. A lighting control system comprising:
   a light switch module comprising:
   a light switch actuator,
   an actuator circuit board system coupled to the light switch actuator, the light switch actuator configured to move with respect to the actuator circuit board system, the actuator circuit board system comprising a low power circuit electrically connected to a low power circuit electrical connector, the low power circuit comprising at least one processor, and a tactile display housed in the light switch actuator and electrically coupled to the at least one processor; and a light switch base module comprising a base housing forming a well configured to receive, at least in part, the actuator circuit board, the well comprising a high power circuit electrical connector for sinking and sourcing high in-line power from and to an electrical wall box, the high power circuit electrical connector configured to engage the low power circuit electrical connector, the high power circuit electrical connector electrically connected to a high power circuit board housed in the base housing, the high power circuit board comprising a voltage reducer.

2. The lighting control system according to claim 1, wherein the actuator circuit board system comprises a circuit board stack.

3. The lighting control system according to claim 1, wherein the high power circuit comprises at least one of a transformer for power conversion to source the light switch module, a current meter, a voltage meter, a processor, a noise filter, a power buffer, a plurality of mosfets for dimming, a triac for dimming, a multi-pin connector, a multi-blade connector an AC/DC converter, an eeprom, a USB port for diagnostics, and an air-gap switch, the air gap switch configured to provide a mechanical gate in a path of a line-in source that springs open when the light switch module is removed from the base module.

4. The lighting control system according to claim 3, wherein the low power circuit further comprises at least one of a wireless radio, a wireless amplifier, a USB port for diagnostics, a DC/DC converter, an ambient light sensor, a near-field proximity sensor, a far-field occupancy sensor, a time-of-flight proximity sensor, a secure eeprom, a rechargeable battery, and a touch display.

5. The lighting control system according to claim 1, wherein the low power circuit further comprises at least one of a microcontroller, a wireless radio, a wireless amplifier, a USB port for diagnostics, a DC/DC converter, an ambient light sensor, a near-field proximity sensor, a far-field occupancy sensor, a time-of-flight proximity sensor, a secure eeprom, a rechargeable battery, and a touch display.

6. The lighting control system according to claim 1, wherein the low power circuit is electrically connected to a rechargeable battery that is electrically connected to the low power circuit electrical connector.

7. The lighting control system according to claim 5, wherein the wireless radio comprises at least one of a WiFi radio, a Bluetooth radio and an 802.15.4 radio.

8. The lighting control system according to claim 1, further comprising a wall plate configured to be coupled to a front of the light switch base module and surround the body of light switch actuator.

9. The lighting control system according to claim 1, wherein the light switch actuator module is removably coupled to the light switch base module.

10. The lighting control system according to claim 1, wherein the light switch actuator is composed, at least in part, of glass.

11. The lighting control system according to claim 1, wherein the voltage reducer comprises at least one of a transformer, a relay, a thyristor, a resistor, and a capacitor.

12. The lighting control system according to claim 1, wherein at least a portion of the light switch actuator is configured to pivot with respect to the actuator circuit board.

13. The lighting control system according to claim 1, wherein at least a portion of the light switch actuator is configured to pivot with respect to the light switch base module.

14. The lighting control system according to claim 1, wherein the light switch module comprises an antenna electrically coupled to the actuator circuit board.

15. The lighting control system according to claim 1, wherein the low power circuit comprises a transceiver.

16. The lighting control system according to claim 1, wherein the low power circuit comprises a Bluetooth module.

17. The lighting control system according to claim 1, wherein the low power circuit includes an 802.15.4 module.

18. The lighting control system according to claim 1, wherein the low power circuit comprises a Wi-Fi module.

19. The lighting control system according to claim 1, wherein the processor of the low power circuit comprises a first microprocessor and the high power circuit comprises a second microprocessor.

20. The lighting control system according to claim 19, wherein at least one of the first microprocessor and the second microprocessor comprises a digital lock and the other one of the first microprocessor and the second microprocessor comprises a digital key, the digital lock and digital key configured to engage one another in response to the light switch module being electrically coupled to the light switch base module to permit the low power circuit to control the high power circuit and to permit the high power circuit to continue powering the low power circuit.

21. The lighting control system according to claim 1, wherein the base module comprises a power source terminal, a power sink terminal, and a ground terminal.

22. The lighting control system according to claim 1, wherein the light switch actuator comprises an electrical contact component, the light switch actuator configured to move the electrical contact component from a first position to a second position to connect an electrical flow path by movement of an actuation surface of the light switch actuator, wherein the the tactile display housed in the light switch actuator is configured for activation by movement of the actuation surface moving the electrical contact component to the second position, the tactile display configured to move contemporaneously with the actuation surface, the tactile display configured to cause selection of a lighting setting selected from a plurality of lighting settings in response to one or more tactile motions on the actuation surface, the tactile display configured to discretely display a distinct icon in response to a change in the selection of the lighting setting.

23. A method of operating a lighting control system, the method comprising:

receiving power in a base module, the base module comprising a base housing forming a well, the well comprising a high power circuit electrical connector electrically connected to a high power circuit board housed in the base housing, the high power circuit board comprising a voltage reducer;

reducing a voltage of the power in the base module;

coupling a light switch module to the base module, the light switch module comprising a light switch actuator coupled to an actuator circuit board system, the light switch actuator configured to move with respect to the actuator circuit board, the actuator circuit board comprising a low power circuit comprising at least one processor, the at least one processor electrically coupled to a tactile display housed in the light switch actuator, the low power circuit electrically connected to a battery that is electrically connected to a low power circuit electrical connector configured to engage the high power circuit electrically connector;

transmitting the power, at least in part, at the reduced voltage, from the base module to the light switch module;

identifying, via the light switch actuator, a lighting profile selected from among a plurality of lighting profiles;

transmitting power data from the light switch module to the base module based on the selected lighting profile, the power data transmitted via the low power circuit electrical connector and the high power circuit electrical connector; and transmitting power from the base module to a light fixture based on the power data.

24. The method according to claim 23, wherein at least one of the high power circuit board and the low power circuit board comprises a circuit board stack.

25. The method according to claim 24, further comprising initiating an unlocking protocol in response to coupling the light switch module to the base module.

26. The method according to claim 24, digitally unlocking a digital lock in the base module via a digital key stored in a memory coupled to the processor in the light switch module.

27. The method according to claim 24, further comprising digitally disabling the base module and the low power provided from the high power circuit electrical connector via a digital key stored in a memory coupled to the processor in the light switch module.

28. The method according to claim 24, wherein identifying a lighting profile comprises at least one of moving the light switch actuator with respect to the actuator circuit board and activating the tactile display electrically coupled to the actuator circuit board via movement of the light switch actuator.

29. The method according to claim 24, wherein identifying a lighting profile comprises providing a command to the light switch actuator remotely over a wireless network.

* * * * *